United States Patent
Schutt et al.

(10) Patent No.: US 6,865,694 B2
(45) Date of Patent: Mar. 8, 2005

(54) CPU-BASED SYSTEM AND METHOD FOR TESTING EMBEDDED MEMORY

(75) Inventors: Nicholas H. Schutt, Sugar Land, TX (US); James M. Jarboe, Jr., Allen, TX (US); Bibo Chen, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 512 days.

(21) Appl. No.: 10/136,818

(22) Filed: Apr. 30, 2002

(65) Prior Publication Data

US 2003/0204782 A1 Oct. 30, 2003

(51) Int. Cl.[7] .............................................. G06F 11/00
(52) U.S. Cl. ........................................ 714/30; 714/733
(58) Field of Search ............................ 714/30, 33, 718, 714/719, 742, 733, 734; 365/201

(56) References Cited

U.S. PATENT DOCUMENTS

| | | | | |
|---|---|---|---|---|
| 5,568,437 A | * | 10/1996 | Jamal | 365/201 |
| 5,572,712 A | * | 11/1996 | Jamal | 716/18 |
| 5,680,544 A | | 10/1997 | Edmondson et al. | 395/183.18 |
| 5,912,901 A | * | 6/1999 | Adams et al. | 714/733 |
| 5,987,632 A | * | 11/1999 | Irrinki et al. | 714/711 |
| 6,098,183 A | * | 8/2000 | Yang | 714/31 |
| 6,253,344 B1 | * | 6/2001 | Fin et al. | 714/738 |
| 6,297,995 B1 | * | 10/2001 | Mc Connell et al. | 365/201 |
| 6,367,042 B1 | * | 4/2002 | Phan et al. | 714/733 |
| 6,378,097 B1 | * | 4/2002 | Fin et al. | 714/738 |
| 6,769,081 B1 | * | 7/2004 | Parulkar | 714/733 |
| 2003/0204796 A1 | * | 10/2003 | Lin et al. | 714/718 |
| 2003/0204805 A1 | * | 10/2003 | Prabhu | 714/756 |
| 2004/0004872 A1 | * | 1/2004 | Templeton et al. | 365/201 |

* cited by examiner

*Primary Examiner*—Scott Baderman
*Assistant Examiner*—Paul Contino
(74) *Attorney, Agent, or Firm*—Robert D. Marshall, Jr.; W. James Brady, III; Frederick J. Telecky, Jr.

(57) ABSTRACT

A CPU-based system 10 and method for testing embedded memory. The technique employs the on-chip CPU 20 itself to test the embedded memory 24. An assembly code program is loaded into the device under test (DUT) 12 to test the memories, determine a repair solution, and write out the repair solution and raw failure information to the tester for defect analysis. The test is driven by an external programmable clock that is provided by the tester to allow the DUT 12 to run up to its maximum input clock rate in order to maximize throughput. The test is not dependent on the pattern rate of the tester.

10 Claims, 2 Drawing Sheets

CPU-BASED SYSTEM AND METHOD FOR TESTING EMBEDDED MEMORY

BACKGROUND OF THE INVENTION

1. Field of the Invention

This invention relates generally to memory testing, and more particularly, to a CPU-based system and method for testing embedded memory.

2. Description of the Prior Art

As the amount of repairable memory increases in digital signal processing (DSP) solutions, traditional test methods have become more time consuming due to the amount of data that needs to be collected. Address and data information related to each memory failure is required to determine a repair solution and also to provide wafer fabrication information necessary to diagnose failure mechanisms. Memory tests have become more difficult to implement due to increased pin and routing requirements, especially in system on a chip (SoC) applications. Dedicated memory testers are expensive, and add complexity to the test flow. Further, implementing traditional memory test techniques on an existing base of logic testers is problematic due to lengthy test times, which are due primarily to inefficient methods of capturing failure data.

U.S. Pat. No. 5,680,544, entitled Method For Testing An On-Chip Cache For Repair, issued Oct. 21, 1997 to Edmondson et al. discloses a CPU-based method of testing an internal cache memory. The method taught by Edmondson et al., however, teaches the added requirement of a special test coprocessor to assist with computing the repair solution.

In view of the foregoing, it would be both desirable and advantageous in the memory testing art to provide a simple, cost-effective technique that substantially reduces memory test time requirements and that is more easily implemented when compared with existing programmable memory test methods.

SUMMARY OF THE INVENTION

The present invention is directed to a CPU-based system and method for testing embedded memory. The technique employs the on-chip CPU itself to test the embedded memory. An assembly code program is loaded into the chip to test the memories, determine a repair solution, and write out the repair solution and raw failure information to the tester for defect analysis. The test is driven by an external programmable clock that is provided by the tester to allow the chip to run up to its maximum input clock rate in order to maximize throughput. The test is not dependent on the pattern rate of the tester.

A high-speed fail capture capability on the test platform is utilized by defining an optimal capture circuitry-chip interface. The interface contains data lines and a strobe signal that toggles whenever valid data is present on the interface. The strobe transitions then serve to latch the fail data into the capture memory on the tester. The strobe signal returns to its original state after one chip internal clock cycle in preparation for the next data word. The width of the external bus can vary as necessary, due to chip design characteristics, so long as it meets the requirements of the fail capture hardware on the tester.

The interface also allows fail data to be captured serially. When data is written out of the serial port, for example, a strobe associated with each output bit will latch the serial bit stream into the tester fail capture memory.

In one aspect of the invention, a CPU-based test system and method provide for testing embedded memories in substantially less time than that achievable using known memory testing solutions.

In another aspect of the invention, a CPU-based test system and method provides a portable solution for testing embedded memories.

In yet another aspect of the invention, a CPU-based test system and method are implemented using simpler test programs than presently necessary when using known memory testing solutions.

One embodiment of the invention comprises a system for testing embedded memory including a VLSI tester having a capture memory; an algorithmic software; a device under test (DUT) having a CPU and an embedded memory; and an external DUT interface configured to allow the DUT CPU to communicate with the VLSI tester capture memory, wherein the DUT CPU operates in response to the algorithmic software to generate embedded memory test data, generate repair data, and transfer the valid test data along with the repair data to the VLSI tester capture memory via the external DUT interface in response to a CPU valid data strobe signal, such that the VLSI tester, controlled solely by the DUT CPU, separates the valid test data from the repair data to allow defect analysis associated with individual failing elements in embedded memory blocks.

Still another embodiment of the invention comprises a method for testing embedded memory including: providing a VLSI tester having a capture memory, an algorithmic software, a device under test (DUT) having a CPU and an embedded memory, and an external DUT interface configured to allow the DUT CPU to communicate with the capture memory; operating the DUT CPU in response to the algorithmic software to generate embedded memory test data and repair data; generating a CPU strobe signal in response to valid test data; and transferring valid test data and the repair data to the capture memory via the external DUT interface in response to the CPU valid data strobe signal such that the VLSI tester, controlled solely by the DUT CPU, separates the test data from the repair data to allow defect analysis of individual failing elements in embedded memory blocks.

BRIEF DESCRIPTION OF THE DRAWINGS

Other aspects, features and advantages of the present invention will be readily appreciated, as the invention becomes better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
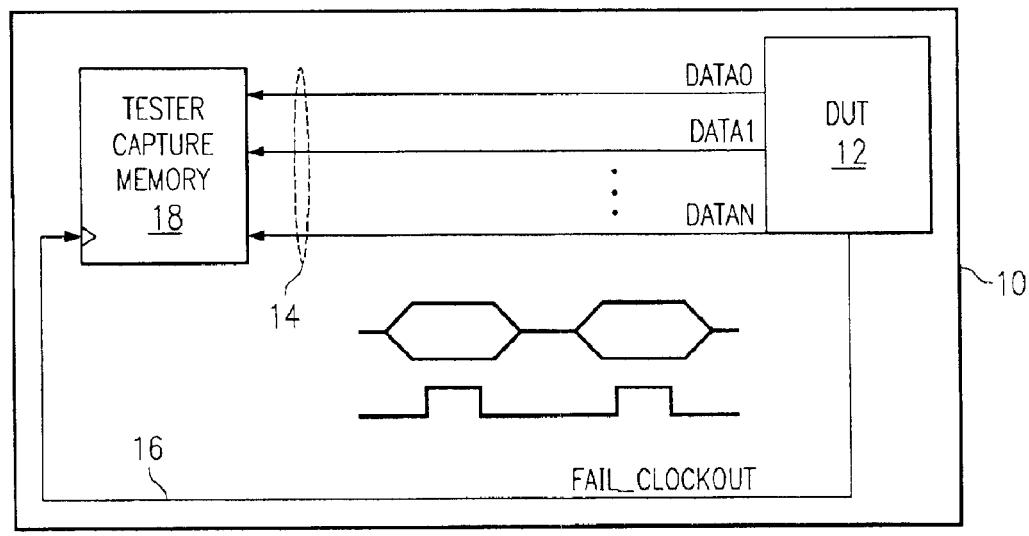
FIG. 1 is a system level block diagram illustrating a device under test (DUT) parallel interface to a VLSI tester according to one embodiment of the present invention.
Figure 2:
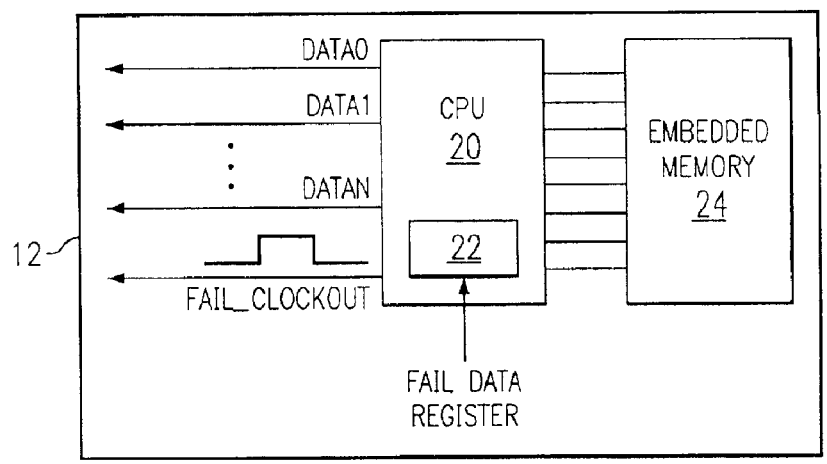
FIG. 2 is a system level block diagram illustrating an internal view of the DUT connection shown in FIG. 1 during CPU built-in self-testing (BIST)

FIG. 1 is a system level block diagram illustrating CPU-based test system 10 having a device under test (DUT) 12 interfaced via a parallel data bus 14 and a strobe signal 16 to a VLSI tester capture memory 18 according to one embodiment of the present invention; while FIG. 2 is a system level block diagram illustrating an internal view of the DUT connection shown in FIG. 1 during CPU built-in self-testing (BIST). With reference now to FIG. 2, the DUT 12 can be seen to include a CPU 20 with a fail data register 22, as well as an embedded memory 24.

Using the CPU 20 to implement memory testing is not new, as stated herein before. Combining the memory test with the ability to compute a repair solution on-chip and to write out repair and fail data however, has not been implemented in any known prior art memory test solution. Until now, a repair solution had to be determined either in a test program running on the tester platform, or offline, outside of the actual test flow. The DUT 12 shown in FIGS. 1 and 2 employs a data strobe 16 to drive the writing of test results to the tester capture memory 18. This process takes place on-the-fly while the test is running at the maximum rated CPU 20 speed, which provides a substantial improvement in test time associated with testers that have capture hardware capable of acquiring the test result data. This process then can be seen to depart significantly from more traditional means of retrieving data from a part such as serial scanning and parallel module testing (PMT).

Importantly, the CPU-based test methodology associated with FIGS. 1 and 2 employs the native CPU that is designed for a customer's application. The only hardware requirement necessary to implement this test system 10 is an external memory interface bus 14 with the desired number of output data lines and a strobe signal 16 that toggles whenever valid data is put on the bus 14. Those skilled in the memory test art will readily appreciate this type of interface is well suited for VLSI testers that have a fail capture memory 18. In this mode of operation, the data that the CPU 20 attempts to write to an external memory address, (i.e. the tester fail capture memory 18), must be transmitted via this external memory bus 14.

Importantly, the BIST architecture for memory testing shown in FIGS. 1 and 2 does not add a ROM and/or external test circuitry such as required with other solutions of BIST for memories known in the prior art. Changing test algorithms in these other solutions of BIST for memories known in the prior art is an arduous process due to the hardwired approach that must be employed to add the ROM and/or external test circuitry. Changing test algorithms using the CPU-based BIST solution depicted in FIGS. 1 and 2 however, is simply a matter of loading new software into the native CPU that is designed for the customer's application. Software is most preferably loaded into the native CPU using the same serial or parallel interface used to offload the repair data. Less preferably, the software is loaded into the native CPU using a different interface when necessary.

Further, the BIST architecture for memory testing shown in FIGS. 1 and 2 allows loading of an assembly code program into the customer's device CPU to test the device memories, determine a repair solution, and write out the repair solution and raw fail information for defect analysis to the tester. As used herein, defect analysis is an analytical process used by engineers and the like to examine the individual failing elements in the memory blocks; and fail data is the actual raw failure information from the device under test (address/data pairs). The test is driven by an external programmable clock that is provided by the tester, which then allows the DUT 12 to be run up to its maximum input clock rate in order to maximize throughput; wherein the test is not dependent on the pattern rate of the tester.

By using a high-speed fail capture capability on the tester platform, and by defining an interface on the DUT 12 that is connected to the tester capture memory 18 in an optimal manner, the bottleneck in gathering the fail data associated with a traditional memory test program is avoided. This interface can be seen to include parallel data bus 14 and a strobe 16 that toggles whenever valid data is present on this interface. The transition of the strobe 16 signal functions to latch the fail data into the capture memory 18 on the tester. The strobe 16 signal most preferably returns to its original state after one DUT 12 internal clock cycle in preparation for the next data word. The width of the external data bus 14 can vary as necessary, due to DUT 12 design, so long as the bus 14 conforms to the requirements of the fail capture hardware on the tester.

Figure 3:
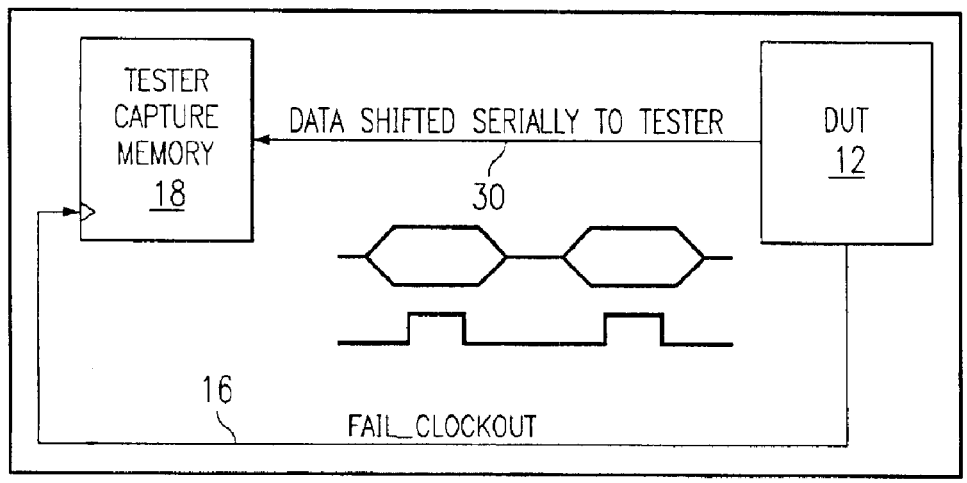
FIG. 3 is a system level block diagram illustrating a DUT serial interface to a VLSI tester according to one embodiment of the present invention.
Figure 4:
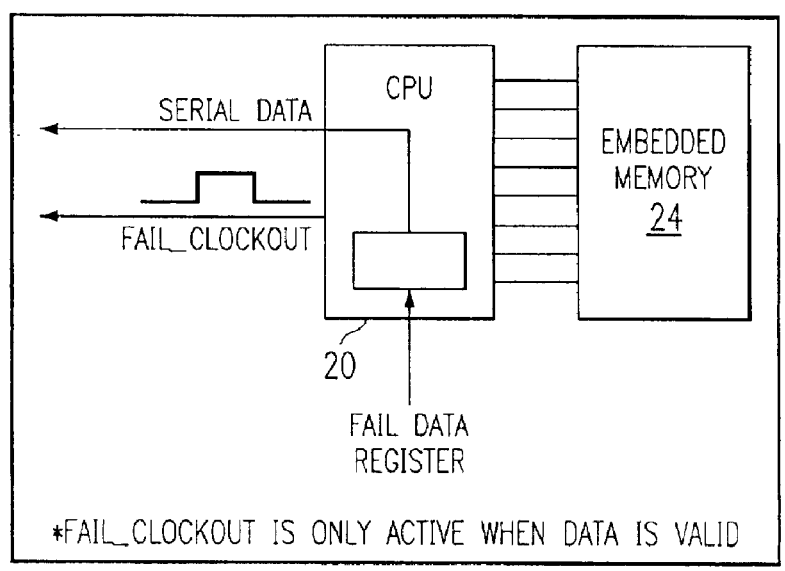
FIG. 4 is a system level block diagram illustrating an internal view of the DUT connection shown in FIG. 3 during CPU BIST.

The present invention is not so limited however, and it shall be understood that in addition to a parallel data bus 14, the fail data can be captured serially as well. In this case, a strobe associated with each output bit will latch the serial bit stream into the tester fail capture memory 18 when data is written out of the serial port. FIG. 3 is a system level block diagram illustrating a DUT 12 serial interface 30 to a VLSI tester capture memory 18 according to one embodiment of the present invention; while FIG. 4 is a system level block diagram illustrating an internal view of the DUT 12 connections shown in FIG. 2 during CPU 20 built-in self-test. Strobe 16 toggles whenever valid data is present on this serial interface 30.

Table 1 below sets forth an algorithmic software assembly code illustrating the set-up of the tester capture memory 18.

TABLE 1 setup for capture RAM on tester

```
procedure FUNCTIONAL_SRAM_TEST;
    var
        TestResult: boolean;
        Status   : integer;
        TestStatus : integer;
        ret_val: option;
    begin
        if (V_DeviceStatus) then
```

TABLE 1-continued setup for capture RAM on tester

```
    begin
        TestOpen(SRAM_TEST);
        ClockSet(S_CLOCK1A, FLASE, 3OMgHz, IO_Voltage, O.Ov);
        (* Setup the Capture RAM on the 32I/O+ board. *)
        InitDataCapture(Pincard1, MSTRBN, CAP_PINS);
        (* Run the RAM tests, storing repair and FAIL data *)
        (* in the capture RAM.         *)
        TestStatus := ExecuteCPUBist(Pincard1, g_ramtest_patt,
            SRAMCol Rep Array, SRAMRowRepArray);
        if ((TestStatus = BAD) OR (TestStatus = TIMEOUT)) then
        begin
            ResultRecord(FAIL);
            end;
            TestClose;
        end;
end; (* FUNCTIONAL_SRAM_TEST)
```

Table 2 below includes an algorithmic software assembly code illustrating initialization of the test platform clock.

TABLE 2 initialization of tester clock

```
Procedure InitDataCapture(Pcard: PinCardList; CapClkPib: PinList; Data_Pins: PinList); Export;
begin
    (* The DUT will clock the capture RAM. The DUT pin (MSTRBN) is *)
    (* connected to pin 26 on the 32I/O+ board.         *)
    Formatset(CapClkPin, S_CAPCLK);
    (* Configure the Dbus pins to be connected to the capture RAM. *)
    Formatset(Data_Pins, S_CAP);
    (* Setup the pins and configure the clock for the capture RAM. *)
    SCRamSetPins(Pcard, S_CAP, Data_Pins);
    SCRamSetClock(Pcard, S_CAP, S_CAPDUTCLK, S_NO_INV);
end;
```

Table 3 below sets forth an algorithmic software assembly code illustrating execution of the pattern containing the CPU 20 BIST code.

TABLE 3 execution of pattern containing CPU BIST code

```
Function ExecuteCPUBist(Pcard: PinCardList; patt: pattern;
var col_repair_array, row_repair_array;
RepairArrayType): Integer, Export;
var
    status   : Integer
    Test_Result: boolean;
    Data_len  : Integer;
    index   : Integer;
    rep_index   : Integer;
    result   : Integer;
    cap_stat: boolean;
    outfile : text;
    Failindex,
    FailPLLength,
    FailPLindex   : integer;
    FailPLArray   : PinListArrayType;
    fail_array : FailArrayType;
begin
    Enable(s_fail_memory);
(* Setup the SC RAM to expect max fails (128K). Also use the PRIME_CAP *)
(* option so that the capture RAM will be ready to capture data    *)
(* immediately once it begins receiving clocks from the device.    *)
    data_len := CapRamSize;
    SCRamSetOptions(Pcard, S_CAP,data_len);
    SCRamEnable(Pcard, S_PRIME_CAP, S_NULL);
```

TABLE 3-continued execution of pattern containing CPU BIST code

```
(* Execute pattern here to load assembly code and run the memory test *)
(* Any repair and/or fail information will be collected by the capture *)
(* RAM during this time      *)
Test_Result := PatternExecute(status, patt);
(* Determine the result of the test (Good, Bad, Repairable, or Timeout) *)
(* and set this as the return value of the function.            *)
if (not(Test_Result)) then
begin
        (* Check to see if the fall was a match loop timeout. *)
        if (status = 2) then
            result := TIMEOUT
        else
        begin
            FallGetPinList(1, FailPLArray, FailPLLength);
            if (FailPLLength > 1)then
                result := BAD;
            case FailPLArray[1] of
                EMUO : (* repairable *)
                result := REPAIRABLE;
                EMU1 :(*fail*)
                    result := BAD;
                otherwise
                    result := BAD;
            end {case}
        end
end
else
    result := GOOD;
    Disable(s_fail_memory);
(* If the test failed then retrieve all information from the capture RAM. *)
(* The repair solution (if applicable) as well as the FAIL data can then *)
(* be extracted.
    if (not(Test_Result)) then
    begin
            discard(SCRamCaptureUnload(Pcard, fail_array, data_len));
(* If the device is repairable then retrieve the repair solution from the *)
(* data in the capture RAM and put it in the user's repair_array.     *)
            if (result = REPAIRABLE) then
                GetRepairSolution(repair_array, fail_array);
(* If the FAIL data flag is turned on then extract the raw fail information from *)
(* the data in the capture RAM and store it in the FAIL data image. If the   *)
(* device passed then there is no need to do this.                *)
            if ((result <> TIMEOUT) AND (result <> GOOD)) then
                BuildFAILImage(fail_array);
    end;
    ExecuteCPUBist := result;
end;
```

Table 4 below sets forth an algorithmic software assembly code illustrating how the data is retrieved from the tester memory (RAM) 18.

TABLE 4 retrieval of data from the capture ram by the tester

```
REPAIR ; ----------------------------
            ; Address is in A, Failing bits in B
; Preserve register contents on the stack
        PSHM T
        SFTL B,15
        PSHM AR7    ; Use AR7 as a pointer to fall memory
        PSHM AH
        SFTL B, 1   ; Shift B left 16 bits to place failing bits in BH (for ROL, below)
        PSHM AL     ; The calling function preserves & restores AL
        PSHM AG     ; Protect AG from ROR
            ; === 1. Point to correct repair word (page number) and set A=colmux
        MVD REPAIR_POS,AR7     ; Get pointer to current repair word #0
        FOR A        ; Carry bit = A[0] -- check if page 0 or 1
            ; and A =A/2
        STM #15,AR3
        AND #00000fh, A      ; A = colmux (16)
        XC 1,C
```

TABLE 4-continued retrieval of data from the capture ram by the tester

```
        MAR *AR7+           ; AR7 '2 repair word for page 1, if C=1 from previous step
        POPM AG       ; Protect AG from ROR
REPAIR_LP ROL B   ; === 2. Cycle through each bit
        PSHM AL           ; Preserve colmux
        BCD SKIP_UD_REPAIR, NC
        MVKD AG,BG            ; Preserve AG in BG
        NOP
; Calculate column address of failing bit.
                ; === 2a. Calculate column number
        MAC AR3, #16, A       ; A = column, colmux = 16
        AND #0fffch, A        ; A = 6/16 - col group = first col # in group (0, 4, 8, 12, ... )
                ; === 2b. Check if repair already specified
        CMPM *AR7, #0         ; Each repair word is initialized to OFFFFh
        ADD #1, A             ; add 1 to make 0 a non-repair (need to subtract off 1 at dump time)
        BC NEW_REPAIR, TC
        XOR *AR7,A            ; Test if new column <> old column (not repairable)
        BC SKIP_UD_REPAIR, AEQ    ; Abort if repair already exists
        ST #0deadh, *AR7      ; If new column, but current column filled, write "dead" to instance
; if engineering mode, then mark device as non-repairable but
; don't stop collecting fails. In this case the repair
; algorithm will no longer be called. If in production, then
; exit the test with a FAIL as soon as the device is not
; repairable.
        ANDM #REPAIRABLE_MASK^0ffffh, *(#DIE_STATUS) ; Turn off the repairable flag
        BITF *(#ENG_PROD_FLAG), #ENG_MODE_FLAG    ; 1 = log all fails, 0 = quit
        NOP
        BC SKIP_CLEAR_CONT_FLAG, TC
        ANDM #(CONTINUE_FLAG^0ffffh), *(ENG_PROD_FLAG) ; Turn off "CONTINUE" flag, if in
production mode
SKIP_CLEAR_CONT_FLAG
        B SKIP_UD_REPAIR
NEW_REPAIR STL A, *AR7        ; Store repair solution
        MVDK AR7, AL
        CALL DUMP_ONE_WORD
SKIP_UD_REPAIR POPM AL        ; Recover colmux
        MVKD BG,AG            ; Recover AG from BG
        BANZ REPAIR_LP, *AR3-
REPAIR_EXIT POPM AH POPM AR7
POPM T
RET
```

In summary explanation of the foregoing, a CPU-based system and method for testing embedded memory provides a solution that combines the memory test with the ability to generate a repair solution on-chip, including both, writing out repair and fail data. The CPU-based test system 10 and methodology shown in FIGS. 1 and 2 discussed herein before provides portability that up till now has not been available with existing CPU-based BIST solutions. This portability allows use of a single architecture to test DUTs associated with different products that use the same CPU core. This single architecture is capable of being ported to other CPUs based on an initial implementation, and allows the collection of all fail data on a DUT (subject to tester capture memory limitations) with only minimal degradation in test time. This is in contradistinction with production programs presently in use that employ PMT or serial scanning in which the amount of fail information collected must be limited in order to keep the test time at reasonable levels.

In view of the above, it can be seen the present invention presents a significant advancement in the art of CPU-based systems and methods for testing embedded memory. Further, this invention has been described in considerable detail in order to provide those skilled in art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A system for testing embedded memory comprising:
   a VLSI tester having a capture memory;
   an algorithmic software;
   a device under test (DUT) having a CPU and an embedded memory; and
   an external DUT interface configured to allow the DUT CPU to communicate with the VLSI tester capture memory, wherein the DUT CPU operates in response to the algorithmic software to generate embedded memory test data, generate repair data, and transfer valid test data along with the repair data to the VLSI tester capture memory via the external DUT interface in response to a CPU valid data strobe signal, such that the VLSI tester, controlled solely by the DUT CPU, separates the valid test data from the repair data to allow defect analysis of individual failing elements in embedded memory blocks.

2. The system for testing embedded memory according to claim 1 wherein the external DUT interface is a parallel data bus.

3. The system for testing embedded memory according to claim 1 wherein the external DUT interface is a serial data bus.

4. The system for testing embedded memory according to claim 1 wherein the system is devoid of any external memory other than memory internal to the VLSI tester and the DUT embedded memory.

5. The system for testing embedded memory according to claim 1 wherein the system is devoid of any test hardware that is external to the VLSI tester, DUT, and external DUT interface.

6. A method for testing embedded memory comprising:

providing a VLSI tester having a capture memory, an algorithmic software, a device under test (DUT) having a CPU and an embedded memory, and an external DUT interface configured to allow the DUT CPU to communicate with the capture memory;

operating the DUT CPU in response to the algorithmic software to generate embedded memory test data and embedded memory repair data;

generating a CPU strobe signal in response to valid test data; and transferring the valid test data and the repair data to the capture memory via the external DUT interface in response to the CPU valid data strobe signal such that the VLSI tester, controlled solely by the DUT CPU, separates the valid test data from the memory repair data to allow defect analysis of individual failing elements associated with embedded memory blocks.

7. The method according to claim 6 wherein the external DUT interface is a parallel data bus.

8. The method according to claim 6 wherein the external DUT interface is a serial data bus.

9. The method according to claim 6 wherein the system is devoid of any external memory other than memory internal to the VLSI tester and the DUT embedded memory.

10. The method according to claim 6 wherein the system is devoid of any test hardware that is external to the VLSI tester, DUT, and external DUT interface.

* * * * *